(12) United States Patent
Satoh et al.

(10) Patent No.: US 11,280,002 B2
(45) Date of Patent: *Mar. 22, 2022

(54) PLACEMENT APPARATUS AND PROCESSING APPARATUS

(71) Applicant: TOKYO ELECTRON LIMITED, Tokyo (JP)

(72) Inventors: Kohichi Satoh, Nirasaki (JP); Toshiaki Fujisato, Nirasaki (JP); Daisuke Toriya, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 117 days.

This patent is subject to a terminal disclaimer.

(21) Appl. No.: 16/574,977

(22) Filed: Sep. 18, 2019

(65) Prior Publication Data

US 2020/0095680 A1 Mar. 26, 2020

(30) Foreign Application Priority Data

Sep. 20, 2018 (JP) .............................. JP2018-176467

(51) Int. Cl.
*C23C 16/458* (2006.01)

(52) U.S. Cl.
CPC ................. *C23C 16/4586* (2013.01)

(58) Field of Classification Search
CPC .................. C23C 16/4586; H01L 21/68792
USPC ........................................................ 118/728
See application file for complete search history.

(56) References Cited

U.S. PATENT DOCUMENTS

| 4,869,801 | A | * | 9/1989 | Helms | ............... | H01L 21/68792 |
| | | | | | | 204/298.15 |
| 2009/0159590 | A1 | * | 6/2009 | Yonekura | ............ | H01L 21/6831 |
| | | | | | | 219/520 |
| 2011/0263123 | A1 | * | 10/2011 | Gomi | .................. | C23C 16/4585 |
| | | | | | | 438/681 |
| 2020/0010956 | A1 | * | 1/2020 | Toriya | ............... | H01L 21/67248 |
| 2020/0083098 | A1 | * | 3/2020 | Satoh | ...................... | C23C 16/46 |
| 2020/0248306 | A1 | * | 8/2020 | Toriya | ................. | C23C 16/4583 |
| 2021/0054503 | A1 | * | 2/2021 | Araki | .................... | C23C 16/405 |

FOREIGN PATENT DOCUMENTS

JP 2009218449 A 9/2009

* cited by examiner

*Primary Examiner* — Charlee J. C. Bennett
(74) *Attorney, Agent, or Firm* — Nath, Goldberg & Meyer; Jerald L. Meyer; Tanya E. Harkins

(57) ABSTRACT

A placement apparatus is provided in the present disclosure. The apparatus includes a stage on which a substrate is placed; a support configured to support the stage from a side of a rear surface of the stage that is opposite to a placement surface on which the substrate is placed; a temperature adjustment member including a plate securing the stage from a lower surface of the stage, a shaft extending downwards from the plate, and a hole accommodating the support through the shaft from the plate, and being capable of a temperature adjustment; a heat-insulating member disposed between the stage and the temperature adjustment member; and an abutment member configured to abut the substrate placed on the stage.

12 Claims, 5 Drawing Sheets

PLACEMENT APPARATUS AND PROCESSING APPARATUS

CROSS-REFERENCE TO RELATED APPLICATION

This application is based upon and claims the benefit of priority from Japanese Patent Application No. 2018-176467, filed on Sep. 20, 2018, the entire contents of which are incorporated herein by reference.

TECHNICAL FIELD

The present disclosure relates to a placement apparatus and a processing apparatus.

BACKGROUND

For example, a processing apparatus that performs a predetermined process such as a film-forming process on a wafer is known.

Patent Document 1 discloses a heat treatment apparatus having a clamp ring member that presses a wafer against a placement stage by its own weight.

PRIOR ART DOCUMENT

Patent Document

Japanese Patent Publication No. 2009-218449

SUMMARY

According to one embodiment of the present disclosure, a placement apparatus. The apparatus includes a stage on which a substrate is placed; a support configured to support the stage from a side of a rear surface of the stage that is opposite to a placement surface on which the substrate is placed; a temperature adjustment member including a plate securing the stage from a lower surface of the stage, a shaft extending downwards from the plate, and a hole accommodating the support through the shaft from the plate, and being capable of a temperature adjustment; a heat-insulating member disposed between the stage and the temperature adjustment member; and an abutment member configured to abut the substrate placed on the stage, wherein the stage further includes: a gas flow path having at least one opening for ejecting a gas; a placement recess in which the substrate is received and placed; and at least one dug-down portion formed at a radially outer side than the placement recess to communicate with the placement recess, and wherein the gas ejected from the opening passes through a space formed between a side surface of the substrate and a side surface of the at least one dug-down portion, and the gas flows radially outwards in a space between the stage and the abutment member.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
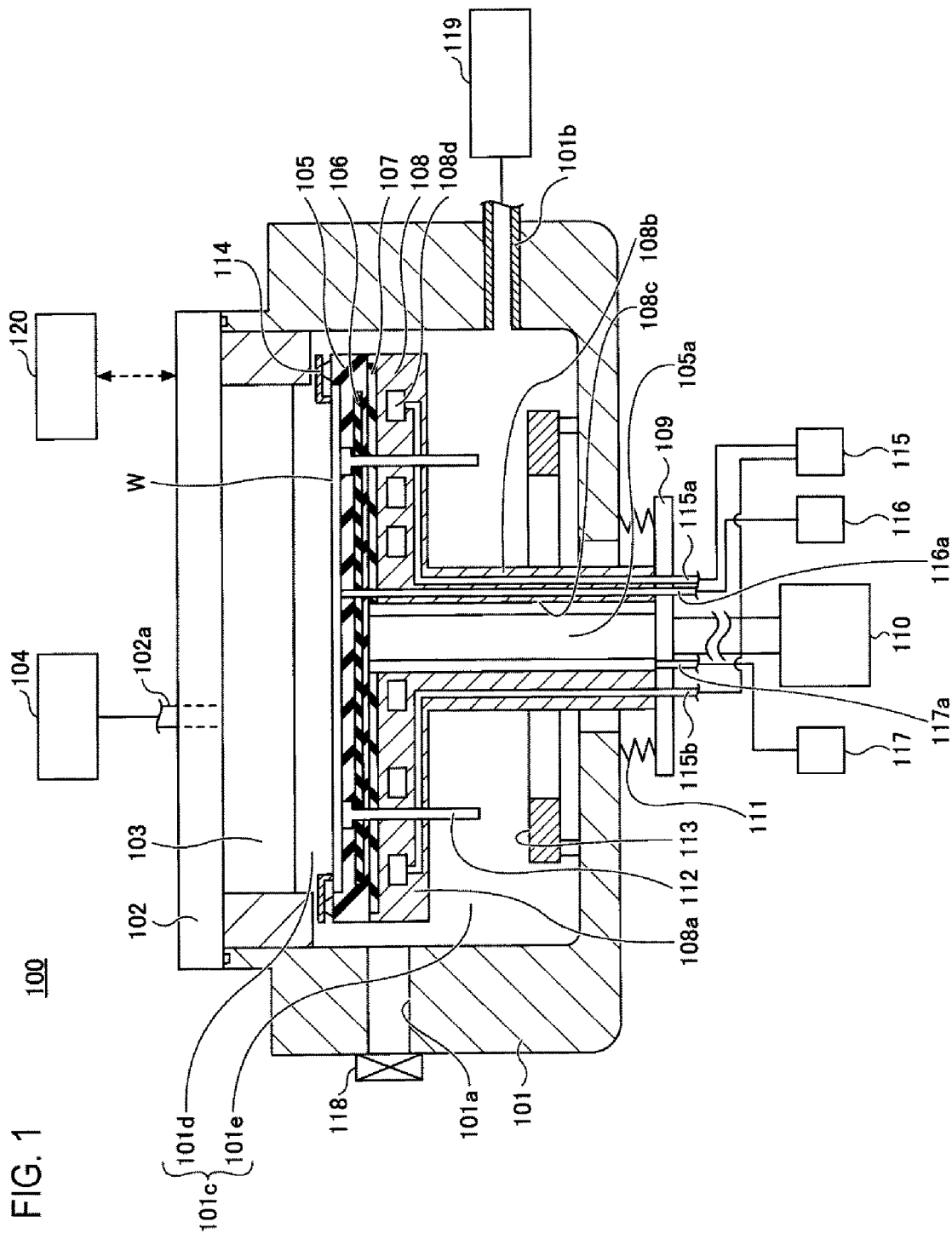
FIG. 1 is a schematic cross-sectional view illustrating an exemplary processing apparatus used for an embedding method according to an embodiment at a processing position.

Reference will now be made in detail to various embodiments, examples of which are illustrated in the accompanying drawings. In each of the drawings, the same components are denoted by the same reference numerals, and redundant descriptions may be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Processing Apparatus>

Figure 2:
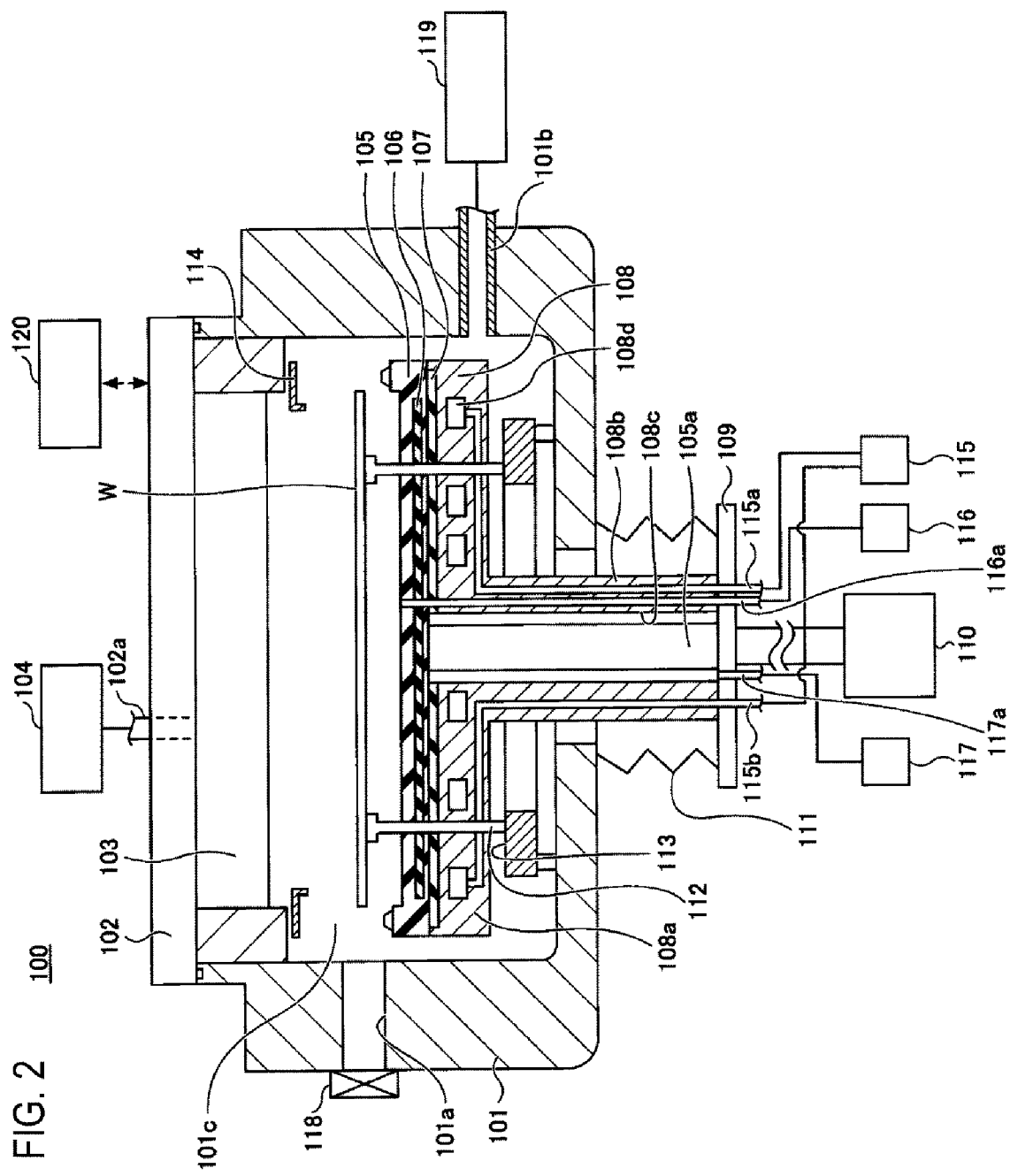
FIG. 2 is a schematic cross-sectional view illustrating the exemplary processing apparatus used for an embedding method according to an embodiment at a delivery position.

An exemplary structure of a processing apparatus 100 according to an embodiment will be described with reference to FIGS. 1 and 2. The processing apparatus 100 illustrated in FIGS. 1 and 2 is a chemical vapor deposition (CVD) apparatus, and is an apparatus that may perform a ruthenium-embedding step for embedding ruthenium. For example, a processing gas such as a ruthenium-containing gas (e.g., dodecacarbonyl triruthenium ($Ru_3(CO)_{12}$)) is supplied, and a predetermined process such as a process of forming a ruthenium film is performed on a wafer W.

A main body container 101 is a container having a bottom and an opening at the upper side of the container. A support member 102 supports a gas ejection mechanism 103. In addition, when the support member 102 closes the upper opening of the main body container 101, the main body container 101 is sealed to form a processing chamber 101c. A gas supply 104 supplies a processing gas such as a ruthenium-containing gas or a carrier gas to the gas ejection mechanism 103 via a supply pipe 102a penetrating the support member 102. The ruthenium-containing gas and the carrier gas supplied from the gas supply 104 are supplied from the gas ejection mechanism 103 into the processing chamber 101c.

A stage 105 may be a member formed in a flat disk shape using aluminum nitride or quartz as a material so as to place a wafer W on the stage 105. A heater 106 is embedded inside the stage 105 so as to heat the wafer W. The heater 106 may be formed of a sheet-shaped resistance-heating element, and generates heat by being supplied with power from a power supply (not illustrated) so as to heat the placement surface of the stage 105 so as to heat the wafer W to a predetermined process temperature suitable for film-formation. For example, the heater 106 heats the wafer W placed on the stage 105 to, for example, 100 to 300 degrees C.

The stage 105 includes a support 105a that extends downward from the center of the lower surface of the stage 105 and penetrates the bottom of the main body container 101. The support 105a has one end supported on a lift mechanism 110 via a lift plate 109.

In addition, a temperature adjustment jacket 108 is provided in the lower portion of the stage 105 as a temperature adjustment member. The temperature adjustment jacket 108 has a plate 108a having substantially the same size as the stage 105 formed at the upper portion of the temperature adjustment jacket 108, and a shaft 108b having a larger diameter than the support 105a and formed at the lower portion of the temperature adjustment jacket 108. In addition, the temperature adjustment jacket 108 has a hole 108c formed through the plate 108a and the shaft 108b in the vertical direction in the center of the temperature adjustment jacket 108. The plate 108a secures the stage 105 from a lower surface of the stage 105, the shaft 108b extends downwards from the plate 108a, and the hole 108c accommodates the support 105a through the shaft 108b from the plate 108a.

The temperature adjustment jacket 108 accommodates the support 105a in the hole 108c, and is disposed so as to cover the support 105a with the hole 108c and to cover the entire rear surface of the stage 105. Since the hole 108c is larger than the diameter of the support 105a, a gap 201 (see FIG. 3) is formed between the support 105a and the temperature adjustment jacket 108. The gap 201 may be approx. 1 to 5 mm.

The temperature adjustment jacket 108 has a coolant flow path 108d formed inside the plate 108a, and two coolant pipes 115a and 115b provided inside the columnar 108b. One end of the coolant flow path 108d is connected to one coolant pipe 115a, and the other end of the coolant flow path 108d is connected to the other coolant pipe 115b. The coolant pipes 115a and 115b are connected to a coolant unit 115.

The coolant unit 115 may be a chiller unit. The coolant unit 115 is capable of controlling the temperature of coolant, and supplies the coolant at a predetermined temperature to the coolant pipe 115a. The coolant is supplied from the coolant unit 115 to the coolant flow path 108d through the coolant pipe 115a. The coolant supplied to the coolant flow path 108d returns to the coolant unit 115 via the coolant pipe 115b. The temperature adjustment jacket 108 is configured to control a temperature of the substrate by circulating a coolant, such as cooling water, in the coolant flow path 108d.

A heat-insulating ring 107 is disposed between the stage 105 and the temperature adjustment jacket 108 as a heat-insulating member. The heat-insulating ring 107 is formed of, for example, SUS316, A5052, Ti (titanium), or ceramic in a disk shape.

Between the heat-insulating ring 107 and the stage 105, a gap is formed in the entire circumferential direction to communicate from the hole 108c to the edge portion of the temperature adjustment jacket 108. For example, the heat-insulating ring 107 is provided with a plurality of protrusions on the upper surface facing the stage 105.

On the heat-insulation ring 107, a plurality of protrusions are formed concentrically in a plurality of (e.g., two) rows at intervals in the circumferential direction. The protrusions may be formed concentrically in one or more rows.

The shaft 108b of the temperature adjustment jacket 108 penetrates the bottom of the main body container 101. The lower end of the temperature adjustment jacket 108 is supported by the lift mechanism 110 via the lift plate 109 disposed below the main body container 101. Since a bellows 111 is provided between the bottom of the main body container 101 and the lift plate 109, the airtightness in the main body container 101 is maintained even though the lift plate 109 moves vertically.

When the lift mechanism 110 raises and lowers the lift plate 109, the stage 105 can be raised and lowered between a processing position (see FIG. 1) at which the wafer W is processed and a delivery position (see FIG. 2) at which the wafer W is delivered between the stage and an external transport mechanism (not illustrated) through a loading/unloading port 101a.

Lift pins 112 support the wafer W from the lower surface of the wafer W and lift the wafer W from the placement surface of the stage 105 when the wafer W is delivered between the stage 105 and the external transport mechanism (not illustrated). Each of the lift pins 112 has a shaft portion and a head portion having a diameter larger than a diameter of the shaft portion. Through holes are formed through the stage 105 and the plate 108a of the temperature adjustment jacket 108, and the shaft portions of the lift pins 112 are inserted through the through holes, respectively. In addition, on the placement surface side of the stage 105, recesses are formed for accommodating the head portions of the lift pins 112, respectively. An abutment member 113 is disposed below the lift pins 112.

In the state in which the stage 105 is moved to the processing position of the wafer W (see FIG. 1), the head portions of the lift pins 112 are accommodated in the recesses, and the wafer W is placed on the placement surface of the stage 105. In addition, the head portions of the lift pins 112 are engaged in the recesses, the shaft portions of the lift pins 112 pass through the stage 105 and the plate 108a of the temperature adjustment jacket 108, and the lower ends of the shaft portions of the lift pins 112 protrude from the plate 108a of the temperature adjustment jacket 108. Meanwhile, in the state in which the stage 105 is moved to the delivery position (see FIG. 2) of the wafer W, the lower ends of the lift pins 112 abuts the abutment member 113 and the head portions of the lift pins 112 protrude from the placement surface of the stage 105. As a result, the head portions of the lift pins 112 support the wafer W from the lower surface of the wafer W and lift the wafer W from the placement surface of the stage 105.

An annular member 114 is disposed above the stage 105. In the state in which the stage 105 is moved to the processing position of the wafer W (see FIG. 1), the annular member 114 comes into contact with the outer peripheral portion of the upper surface of the wafer W, and presses the wafer W against the placement surface of the stage 105 by the own weight of the annular member 114. Meanwhile, in the state in which the stage 105 is moved to the delivery position of the wafer W (see FIG. 2), the annular member 114 is engaged with an engagement portion (not illustrated) above the loading/unloading port 101a so as not to hinder the delivery of the wafer W by the transport mechanism (not illustrated).

Figure 3:
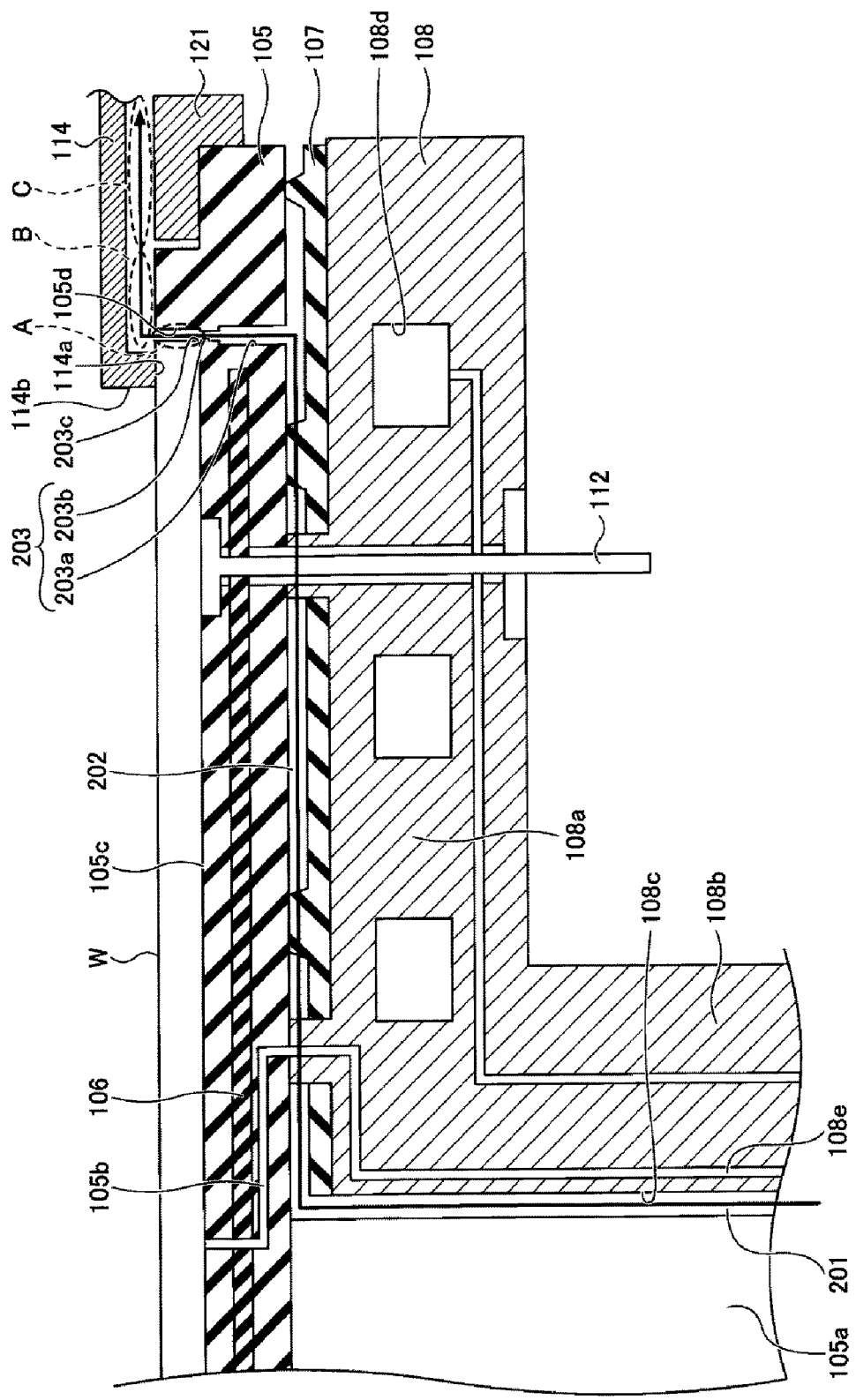
FIG. 3 is a schematic cross-sectional view illustrating a purge gas flow path in the exemplary processing apparatus according to an embodiment.

The heat transfer gas supply 116 supplies a heat transfer gas such as He gas to the space between the rear surface of the wafer W placed on the stage 105 and the placement surface of the stage 105 through the pipe 116a, the flow path 108e formed in the temperature adjustment jacket 108 (see FIG. 3) and the flow path 105b formed in the stage 105 (see FIG. 3).

The purge gas supply 117 supplies a purge gas (e.g., CO gas) to the space between the lower surface of the annular member 114 and the upper surface of the stage 105 through the pipe 117a, a gap 201 (see FIG. 3) formed between the support 105a of the stage 105 and the hole 108c of the temperature adjustment jacket 108, a first flow path 202 (see FIG. 3) formed between the stage 105 and the heat-insulating ring 107 and extending outwards in the radial direction, and a second flow path 203 (see FIG. 3) formed in the outer peripheral portion of the stage 105 in the vertical direction. Thus, the processing gas is prevented from flowing into the space between the lower surface of the annular member 114 and the upper surface of the stage 105, thereby preventing a film from being formed on the lower surface of the annular member 114 or the upper surface of the outer peripheral portion of the stage 105. In addition, the second flow path 203 includes a third flow path 203a and a fourth flow path 203b.

The side wall of the main body container 101 is provided with a loading/unloading port 101a for loading/unloading the wafer W and a gate valve 118 for opening/closing the loading/unloading port 101a.

An exhauster 119 including a vacuum pump and the like is connected to the lower side wall of the main body container 101 through an exhaust pipe 101b. The inside of the main body container 101 is evacuated by the exhauster 119, so that the inside of the processing chamber 101c is set and maintained at a predetermined vacuum atmosphere (e.g., 1.33 Pa).

A controller 120 controls the operation of the processing apparatus 100 by controlling the gas supply 104, the heater 106, the lift mechanism 110, the coolant unit 115, the heat transfer gas supply 116, the purge gas supply 117, the gate valve 118, the exhauster 119, and the like.

An exemplary operation of the substrate processing system 100 will be described. At the start of the operation, the inside of the processing chamber 101c is in a vacuum atmosphere by the exhauster 119. In addition, the stage 105 is moved to the delivery position.

The controller 120 opens the gate valve 118. Here, a wafer W is placed on the lift pins 112 by an external transport mechanism (not illustrated). When the transport mechanism (not illustrated) comes out of the loading/unloading port 101a, the controller 120 closes the gate valve 118.

The controller 120 controls the lift mechanism 110 to move the stage 105 to the processing position. In this operation, as the stage 105 is raised, the wafer W placed on the lift pins 112 is placed on the placement surface of the stage 105. In addition, the annular member 114 comes into contact with the outer peripheral portion of the upper surface of the wafer W, and presses the wafer W against the placement surface of the stage 105 by the own weight of the annular member 114. Accordingly, an upper space 101d above the stage 105 and a lower space 101e below the stage 105 are formed in the processing chamber 101c.

At the processing position, the controller 120 operates the heater 106, and controls the gas supply 104 to supply a processing gas such as ruthenium-containing gas or a carrier gas from the gas ejection mechanism 103 into the upper space 101d of the processing chamber 101c. As a result, a predetermined process such as film-formation is performed on the wafer W. After the process, the gas flows into the lower space 101e from the upper space 101d through the flow path on the upper surface side of the annular member 114, and is exhausted through the exhaust pipe 101b by the exhauster 119.

In this operation, the controller 120 controls the heat transfer gas supply 116 to supply the heat transfer gas to the space between the rear surface of the wafer W placed on the stage 105 and the placement surface of the stage 105. In addition, the controller 120 controls the purge gas supply 117 to supply the purge gas to the space between the lower surface of the annular member 114 and the upper surface of the stage 105. The purge gas flows into the lower space 101e through the flow path on the lower surface side of the annular member 114, and is exhausted through the exhaust pipe 101b by the exhauster 119.

When a predetermined processing is completed, the controller 120 controls the lift mechanism 110 to move the stage 105 to a receiving position. In this operation, when the stage 105 is lowered, the annular member 114 is engaged with an engagement portion (not illustrated). In addition, when the lower ends of the lift pins 112 abut the abutment member 113, the head portions of the lift pins 112 protrude from the placement surface of the stage 105 and lift the wafer W from the placement surface of the stage 105.

The controller 120 opens the gate valve 118. Here, the wafer W placed on the lift pins 112 is unloaded by the external transport mechanism (not illustrated). When the transport mechanism (not illustrated) comes out of the loading/unloading port 101a, the controller 120 closes the gate valve 118.

As described above, with the processing apparatus 100 illustrated in FIG. 1, a predetermined process such as film-formation may be performed on a wafer W.

<Purge Gas Flow Path of Processing Apparatus of an Embodiment>

Figure 4:
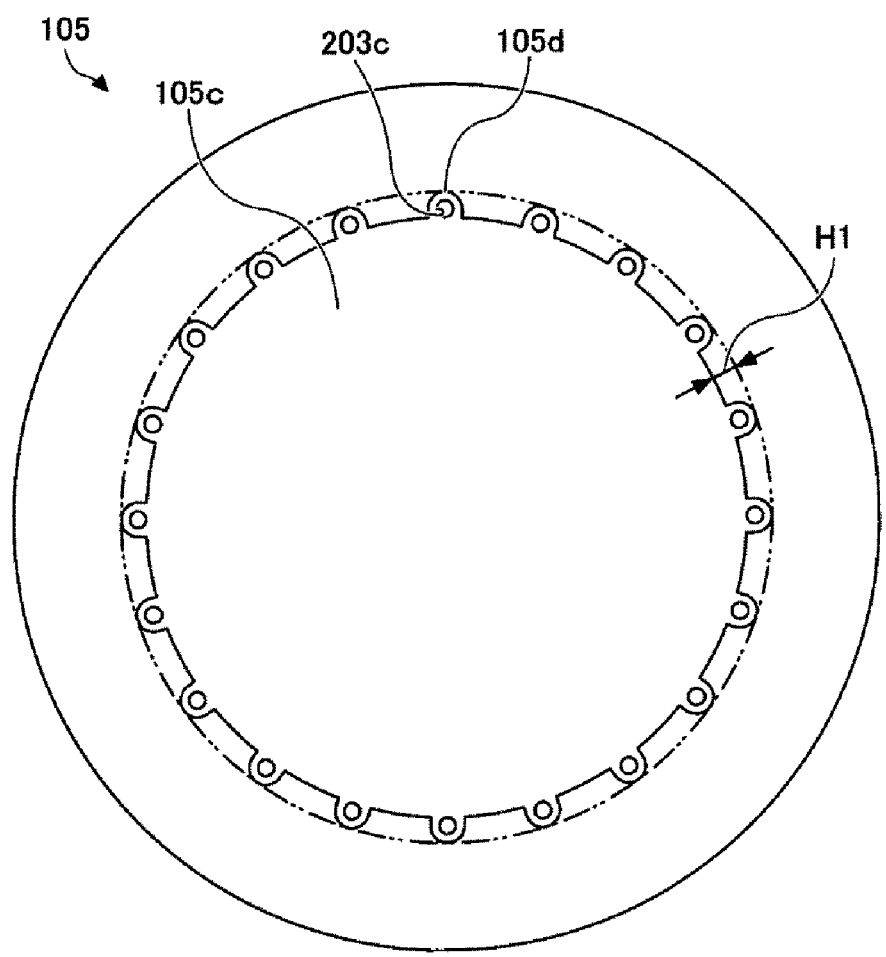
FIG. 4 is a plan view of an exemplary stage in the processing apparatus according to an embodiment.

Next, the purge gas flow path of the processing apparatus 100 will be further described with reference to FIGS. 3 and 4. The flow of the purge gas is indicated by arrows in FIG. 3. In FIG. 4, the recesses for accommodating the head portions of the lift pins 112 and the opening of the heat transfer gas flow path 105b are not illustrated. The stage 105 that includes the heater 106, the heat-insulating ring 107, the temperature adjustment jacket 108, and the annular member 114 are collectively referred to as a placement apparatus.

As illustrated in FIG. 3, the diameter of the support 105a of the stage 105 is smaller than the diameter of the hole 108c of the temperature adjustment jacket 108, and a gap 201 is formed between the support 105a of the stage 105 and the hole 108c of the temperature adjustment jacket 108.

The second flow path 203 formed in the vertical direction has a third flow path 203a formed from the rear surface side of the stage 105 and a fourth flow path 203b communicating with the third flow path 203a. The fourth flow path 203b penetrates to the surface side of the stage 105 to form an opening 203c. The flow path cross-sectional area of the fourth flow path 203b is smaller (e.g., 50% to 98% smaller) than the flow path cross-sectional area of the third flow path 203a. As illustrated in FIG. 4, a plurality of (e.g., 48) the openings 203c are formed at predetermined regular intervals in the circumferential direction of the stage 105.

As illustrated in FIGS. 3 and 4, the stage 105 has a placement recess 105c formed to receive and place a wafer W in the placement recess 105c. The placement recess 105c has a circular shape in a plan view, and the diameter of the placement recess 105c is slightly larger than the diameter of the wafer W. In addition, as illustrated in FIG. 4, a plurality of dug-down portions 105d are formed at the radially outer side than the placement recess 105c, for example, at the outer side by a distance H1 from the end (corner) where the bottom surface and the side surface of the placement recess 105c intersect each other to communicate with the placement recess 105c at regular intervals like the openings 203c. The distance H1 may be 2 mm to 3 mm. The height of the bottom surface of the placement recess 105c is equal to the height of the bottom surfaces of the dug-down portions 105d. The openings 203c of the second flow path 203 are provided on the bottom surfaces of the dug-down portions 105d. In other words, when the stage 105 is viewed in a plan view, the openings 203c are formed at the outer side than the circular shape of the placement recess 105c. When the stage 105 is viewed in a plan view, the circular shape of the placement recess 105c and the circular shapes of the openings 203c may be in contact with each other. Therefore, when a wafer W is placed in the placement recess 105c, the wafer W does not close the openings 203c even if the wafer W is displaced in the placement recess 105c such that the side surface of the wafer W is brought into contact with the side wall of the placement recess 105c. In addition, when a purge gas is ejected from the openings 203c, it is possible to prevent a distribution from being broken.

When the stage 105 is viewed in a plan view, by forming the openings 203c outside the circular shape of the placement recess 105c, it is possible to make the diameter of the heater 106 disposed below the placement recess 105c close to the diameter the circular shape of the placement recess 105c. For example, the diameter of the heater 106 may be set to be equal to or greater than the diameter of the inner peripheral surface 114b of the annular member 114 that abuts the outer peripheral portion of the wafer W. This makes it possible to uniformly heat the wafer W in an area inside the inner peripheral surface 114b of the annular member 114, which is an area in which film-formation is performed on the wafer W, so that it is possible to improve the uniformity of the film-formation.

The purge gas supplied from the purge gas supply 117 flows through the pipe 117a (see FIG. 1), the gap 201, and the first flow path 202. Then, the purge gas flows through the third flow path 203a and the fourth flow path 203b, and is ejected from the openings 203c. The ejected purge gas flows through the space A between the side surface of the wafer W and the side surfaces of the dug-down portions 105d, the space B between the lower surface of the annular member 114 and the upper surface of the outer periphery of the stage 105, the space C between the lower surface of the annular member 114 and the upper surface of an edge ring 121 disposed at the outer peripheral edge of the stage 105, the lower space 101e (see FIG. 1), and the exhaust pipe 101b (see FIG. 1), and is exhausted to the outside of the processing chamber 101c by the exhauster 119.

As described above, in the processing apparatus 100 according to an embodiment, even if the processing gas is infiltrated into the space on the lower surface side of the annular member 114 from the gap between the wafer W and an abutment portion 114a of the annular member 114, the processing gas may be pushed out by the flow of the purge gas from the space B between the lower surface of the annular member 114 and the upper surface of the outer peripheral portion of the stage 105, and the space C between the lower surface of the annular member 114 and the upper surface of the edge ring 121 disposed at the outer peripheral edge of the stage 105. This makes it possible to prevent a film from being formed on the lower surface of the annular member 114 and the upper surface of the outer peripheral portion of the stage 105. Since the gap between the wafer W and the abutment portion 114a of the annular member 114 is capable of being filled with the purge gas, it is possible to form a non-film formation area on the upper surface of the outer peripheral portion of the wafer W.

<Purge Gas Flow Path of Processing Apparatus of Reference Example>

Here, a purge gas flow path in a processing apparatus 100 according to a reference example will be described with reference to FIG. 5. The flow of the purge gas is indicated by arrows in FIG. 5.

Figure 5:
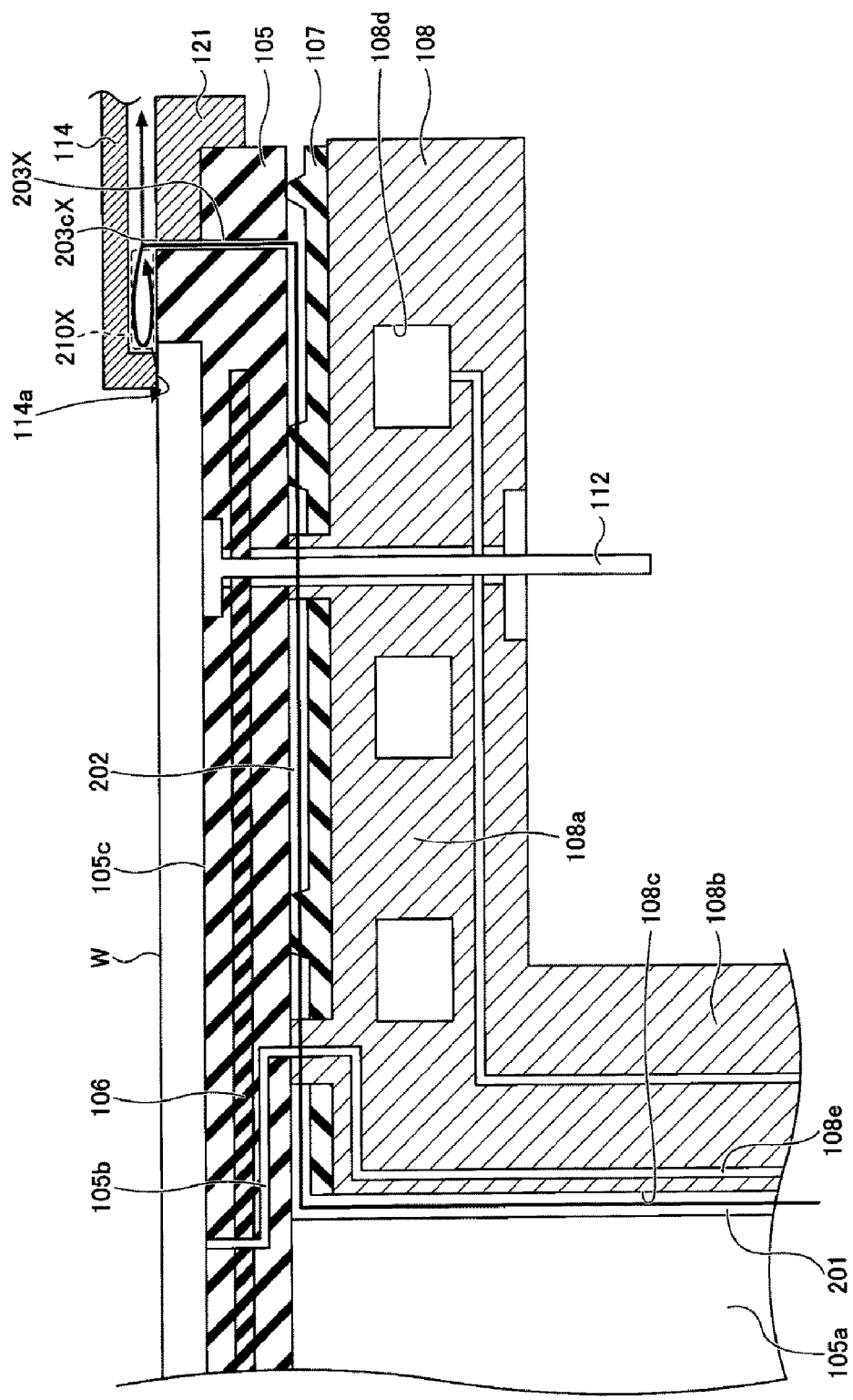
FIG. 5 is a schematic cross-sectional view illustrating a purge gas flow path in a processing apparatus according to a reference example.

The purge gas flow path in the processing apparatus according to the reference example illustrated in FIG. 5 differs from the processing apparatus 100 according to the embodiment illustrated in FIG. 3 in view of a vertical flow path 203X formed in the outer peripheral portion of the stage 105. The flow path 203X uses the gap between the stage 105 and the edge ring 121 as a part of the flow path. The purge gas ejected from an ejection port 203cX of the flow path 203X flows radially outwards as indicated arrows in FIG. 5. For this reason, a staying space 210X, in which the gas stays, is formed between the lower surface of the annular member 114 and the upper surface of the outer peripheral portion of the stage 105 and from the ejection port 203cX to the abutment portion 114a of the annular member 114. In the processing apparatus according to the reference example, the pressure in the staying space 210X is made to be higher than the pressure in the processing space (upper space 101d) of the wafer W by making the purge gas stay in the staying space 210X, so that the processing gas is hindered from flowing into the staying space 201X from the gap between the wafer W and the abutment portion 114a of the annular member 114, thereby preventing a film from being formed on the lower surface of the annular member 114 and the upper surface of the outer peripheral portion of the stage 105.

In order to stabilize the process before the processing apparatus 100 performs a predetermined process on the wafer W, precoating is performed to form in advance a film on the inner wall in the main body container 101, the surface of the gas ejection mechanism 103 for supplying the processing gas, the surface of the stage 105, the surface of the annular member 114, and the like. In the pre-coating, a processing gas, which is the same as a processing gas used for a process performed on a wafer W, is supplied to the processing chamber 101c, for example, in the state in which the wafer W is not placed on the stage 105. As a result, for example, a ruthenium film is formed on the inner wall in the main body container 101, the surface of the gas ejection mechanism 103 for supplying the processing gas, the placement recess 105c and the outer peripheral surface of the stage 105, the upper and lower surfaces of the annular member 114, and the like. The film is formed on the outer peripheral surface of the stage 105 and the lower surface of the annular member 114 because precoating is performed in the state in which no wafer W is placed and thus the processing gas flows is introduced from a gap. In addition, aluminum is thermally sprayed on the surface of the annular member 114, and fine irregularities are formed on the surface of the annular member 114. For this reason, the peeling of the thin film, formed on the surface of the annular member 114 through precoating, is reduced due to an anchor effect.

As described above, the purge gas flows on the lower surface of the annular member 114 and the upper surface of the outer peripheral portion of the stage 105. Since the purge gas comes into contact with the lower surface of the annular member 114 or the upper surface of the outer peripheral portion of the stage 105, at least one of the thin film formed on the lower surface of the annular member 114 or the thin film formed on the upper surface of the outer peripheral portion of the stage 105 is peeled off to be a source of particles. In addition, the fine irregularities generated by thermal spraying may be peeled off to be a source of particles.

Here, in the processing apparatus according to the reference example illustrated in FIG. 5, a part of the purge gas ejected from the ejection port 203cX stays in the staying space 210X as indicated by arrows in FIG. 5. For this reason, some of the particles formed as the thin film or the like is peeled off stay in the staying space 210X. In addition, the pressure in the staying space 210X is higher than the pressure in the processing space (upper space 101d) for the wafer W. Therefore, as indicated by arrows in FIG. 5, the particles in the staying space 210X flow into the processing space for the wafer W through the gap between the wafer W and the abutment portion 114a of the annular member 114 together with the purge gas in the staying space 210X. As described above, in the processing apparatus according to the reference example, the purge gas ejected from the ejection port 203cX branches and flows. One flows radially outwards in the space between the lower surface of the annular member 114 and the upper surface of the stage 105. The other flows into the processing space for the wafer W through the gap between the wafer W and the abutment portion 114a of the annular member 114 via the staying space 210X. For this reason, particles may be generated at the outer peripheral portion of the wafer W.

In contrast, in the processing apparatus 100 according to the embodiment illustrated in FIG. 3, the purge gas ejected from the opening 203c passes through the space A between the side surface of the wafer W and the side surfaces of the dug-down portions 105d as indicated by arrows in FIG. 3, and then flows outwards in the space between the lower surface of the annular member 114 and the upper surface of the stage 105. For this reason, particles generated on the lower surface of the annular member 114 or the upper surface of the outer peripheral portion of the stage 105 are discharged following the flow of the purge gas flowing outwards in the radial direction. This makes it possible to suppress the inflow of particles into the processing space for the wafer W through the gap between the wafer W and the abutment portion 114a of the annular member 114. In addition, it is possible to suppress the occurrence of particles at the outer peripheral portion of the wafer W.

A space may be formed at the joint between the stage 105 and the edge ring 121, and a gas may stay in the space to cause particles. However, even if particles are generated from the inside of the staying space, since the particles flow radially outwards due to the flow of the purge gas, it is possible to suppress the inflow of the particles into the processing space for the wafer W through the gap between the wafer W and the abutment portion 114a of the annular member 114.

In addition, as illustrated in FIG. 3, by setting the flow path cross-sectional area of the fourth flow path 203b to be smaller than the flow path cross-sectional area of the third flow path 203a, it is possible to increase the flow speed of the purge gas ejected from the openings 203c. In addition, it is possible to make the conductance of the second flow path 203 equal to the conductance of the flow path 203X of the reference example by increasing the flow path cross-sectional area of the third flow path 203a. In addition, since it is possible to reduce the depth of the fourth flow path 203b having a small diameter, the processability thereof is improved.

In the processing apparatus 100 according to an embodiment, the pressure in the space on the lower surface side of the annular member 114 is reduced by increasing the flow speed of the purge gas, so that the purge gas flowing into the processing space for the wafer W through the gap between the wafer W and the abutment portion 114a of the annular member 114 is reduced. This makes it possible to suppress the inflow of particles with the purge gas.

As illustrated in FIG. 4, the dug-down portions 105d are each formed in a substantially circular shape in a plan view. The diameter of the arc of each dug-down portion 105d in a plan view is set to be equal to or larger than the diameter of the circle of the fourth flow path 203b. In addition, the diameter of the arc of the dug-down portion 105d is set to be equal to or less than the diameter of the circle of the third flow path 203a. This makes it possible to prevent the flow speed of the gas ejected from the opening 203c from being excessively reduced in the space A.

The processing apparatus 100 of the present disclosure has been described as a CVD apparatus, but is not limited thereto. The processing apparatus 100 may be a plasma processing apparatus. An applicable plasma apparatus may be any of a capacitively coupled plasma (CCP) type, an inductively coupled plasma (ICP) type, a radial line slot antenna (RLSA) type, an electron cyclotron resonance plasma (ECR) type, and a helicon wave plasma (HWP) type.

In the present disclosure, a wafer W has been described as an example of a substrate. However, the substrate is not limited thereto, and may be any of various substrates used for a flat panel display (FPD), a printed circuit board, or the like.

According to an aspect, it is possible to provide a placement apparatus and a processing apparatus that reduce particles.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A placement apparatus, the apparatus comprising:
   a stage on which a substrate is placed;
   a support configured to support the stage from a side of a rear surface of the stage that is opposite to a placement surface on which the substrate is placed;
   a temperature adjustment member including a plate securing the stage from a lower surface of the stage, a shaft extending downwards from the plate, and a hole accommodating the support through the shaft from the plate, and being capable of a temperature adjustment;
   a heat-insulating member disposed between the stage and the temperature adjustment member; and
   an annular member configured to abut the substrate placed on the stage,
   wherein the stage further includes:
      a gas flow path having at least one opening for ejecting a gas;
      a placement recess in which the substrate is received and placed; and
      at least one dug-down portion formed at a radially outer side than the placement recess to communicate with the placement recess, and
   wherein the gas ejected from the opening passes through a space formed between a side surface of the substrate and a side surface of the at least one dug-down portion, and the gas flows radially outwards in a space between the stage and the annular member, wherein the gas flow path has a first flow path formed between the rear surface of the stage and an upper surface of the heat-insulating member, and a second flow path one end of which communicates with the first flow path and the other end of which communicates with the at least one opening, wherein the second flow path has a third flow path formed from the rear surface of the stage, and a fourth flow path one end of which communicates with the third flow path and the other end of which communicates with the at least one opening, and wherein a flow path cross-sectional area of the fourth flow path is smaller than a flow path cross-sectional area of the third flow path.

2. The placement apparatus of claim 1, wherein the at least one opening of the gas flow path is formed in a bottom surface of the at least one dug-down portion, and wherein the at least one dug-down portion includes a plurality of dug-down portions provided and disposed at regular intervals.

3. The placement apparatus of claim 1, wherein the at least one opening of the gas flow path has a circular shape, and wherein a circular shape of the placement recess and the circular shape of the at least one opening are in contact with each other when the stage is viewed in a plan view.

4. The placement apparatus of claim 2, wherein the at least one opening of the gas flow path has a circular shape, and wherein a circular shape of the placement recess and the circular shape of the at least one opening are in contact with each other when the stage is viewed in a plan view.

5. The placement apparatus of claim 1, wherein the at least one dug-down portion has a diameter that is equal to or larger than a diameter of the fourth flow path, and is equal to or smaller than a diameter of the third flow path.

6. The placement apparatus of claim 5, wherein the at least one opening of the gas flow path is provided at a position at a more upstream side of an abutment portion of the substrate and the annular member.

7. The placement apparatus of claim 6, wherein the stage has a heater inside to heat the substrate, and wherein the heater has a size equal to or larger than a diameter of an inner peripheral surface of the annular member when the annular member abuts the substrate.

8. The placement apparatus of claim 7, wherein the gas is a purge gas that pushes out a processing gas from the space between the stage and the annular member, the processing gas flows from the abutment portion between the substrate and the annular member into the space between the stage and the annular member.

9. The placement apparatus of claim 1, wherein the at least one opening of the gas flow path is provided at a position at a more upstream side of an abutment portion between the substrate and the annular member.

10. The placement apparatus of claim 1, wherein the stage has a heater inside to heat the substrate, and wherein the heater has a size equal to or larger than a diameter of an inner peripheral surface of the annular member when the annular member abuts the substrate.

11. The placement apparatus of claim 1, wherein the gas is a purge gas that pushes out a processing gas from the space between the stage and the annular member, the processing gas flows from an abutment portion between the substrate and the annular member into the space between the stage and the annular member.

12. A processing apparatus, the processing apparatus comprising the placement apparatus according to claim 1.

* * * * *